United States Patent [19]

Masumoto et al.

[11] Patent Number: 5,343,167
[45] Date of Patent: Aug. 30, 1994

[54] ONE-SHOT CONTROL CIRCUIT FOR TRACKING A VOLTAGE-CONTROLLED OSCILLATOR

[75] Inventors: Rodney T. Masumoto, Tustin; Jenn-Gang Chern, Yorba Linda, both of Calif.

[73] Assignee: Silicon Systems, Inc., Tustin, Calif.

[21] Appl. No.: 13,006

[22] Filed: Feb. 3, 1993

[51] Int. Cl.⁵ .................. H03L 7/06; H03L 7/07; H03L 7/08
[52] U.S. Cl. .................................. 331/2; 331/17; 331/18; 331/25; 375/120
[58] Field of Search ............... 331/2, 17, 18, 25, 34; 375/120

[56] References Cited

U.S. PATENT DOCUMENTS

| | | | |
|---|---|---|---|
| 4,667,168 | 5/1987 | Shiomi et al. | 331/1 R |
| 4,868,522 | 9/1989 | Popat et al. | 331/2 |
| 5,043,677 | 8/1991 | Tomassetti et al. | 331/2 |
| 5,124,669 | 6/1992 | Palmer et al. | 307/273 X |
| 5,172,397 | 12/1992 | Llewellyn | 307/269 X |

*Primary Examiner*—David Mis
*Attorney, Agent, or Firm*—Hecker & Harriman

[57] ABSTRACT

A one-shot control mechanism for ensuring close tracking of one-shot period to VCO period. The one-shot control mechanism provides immunity to data jitter and other spurious phenomena as well as stable and accurate tracking of one-shot period even when the VCO frequency varies from the center frequency of the VCO. The present invention includes a data capture PLL circuit and a frequency reference PLL circuit. The frequency reference PLL circuit provides a control signal to one or more one-shots to control their output pulse duration. Since the frequency reference PLL circuit operates at the expected frequency of data input, a relatively constant relationship may be maintained between the output pulse duration of the one-shots and the period of the VCO output.

18 Claims, 3 Drawing Sheets

ONE-SHOT CONTROL CIRCUIT FOR TRACKING A VOLTAGE-CONTROLLED OSCILLATOR

BACKGROUND OF THE INVENTION

1. FIELD OF THE INVENTION

The present invention relates generally to one-shot circuits (monostable multivibrators) and more particularly to a one-shot circuit for tracking the period of a voltage-controlled oscillator (VCO).

2. BACKGROUND ART

One-shots are often used when a pulse of a controlled duration is required. One-shots are triggered by a rising or falling edge of an input signal. The input pulse must have a minimum width, but may be longer or shorter than the output pulse. The duration of a pulse generated by one-shot is often controlled by selecting external components, such as resistors and capacitors. Such components often have fixed values, preventing the adjustment of one-shot duration to match other circuit parameters. An example of circuit using a one-shot is given by U.S. Pat. No. 5,124,669, issued to Michael J. Palmer and Richard G. Yamasaki on Jun. 23, 1992 and incorporated herein by reference.

It may be desirable to use a one-shot in conjunction with a VCO. A VCO provides an output signal that varies in frequency in response to a control voltage. Since the frequency variability of a VCO results in variation of the period of the output signal, the duration of a one-shot used in conjunction with the VCO must be adjusted to maintain the appropriate proportional relationship between VCO period and one-shot duration.

In the prior art, a voltage reference is used to control the VCO in a phase-locked loop (PLL) used to extract clock timing information from an asynchronous data stream. The same voltage reference is also used to control the period of a one-shot. If the VCO is running at its center frequency, the one-shot duration is quite accurate, but if the VCO is operating at a frequency different from its center frequency, inaccuracies develop in the one-shot frequency. The error in the one-shot frequency tracks the percentage difference of the VCO frequency from its center frequency.

FIG. 1 illustrates a prior art circuit for controlling the duration of a one-shot pulse. FIG. 1 illustrates data recovery PLL circuit 101 and frequency reference PLL circuit 102. In the prior art, data recovery PLL circuit 101 and frequency reference PLL circuit 102 have been implemented as physically separate devices, typically in separate integrated circuits, preventing effective communication of signals between the circuits.

Data recovery PLL circuit 101 includes ⅓ cell delay one-shot 103, phase detector 104, CP block 105, loop filter 106, VCO control block 107, VCO 108, read reference clock (RRC) pulse width one-shot 109, write precompensation one-shot 110, inputs RD, RD* and VREF, Outputs VCOOUT and VCOOUT* and nodes 151, 152, 153, 154, 155, 156, 157, 158, 159, 160, 161, 162, 163, 164, 165, and 166.

Input RD is coupled to node 151, which is coupled to an input of ⅓ cell delay one-shot 103. Input RD* is coupled to node 152, which is coupled to another input of ⅓ cell delay one-shot 103. Input VREF is coupled to node 53, which is coupled to yet another input of ⅓ cell delay one-shot 103, to an input of RRC pulse width one-shot 109 and to an input of write precompensation one-shot 110. One output of ⅓ cell delay one-shot 103 is coupled to node 154, which is coupled to an input of phase detector 104. Another output of ⅓ cell delay one-shot 103 is coupled to node 155, which is coupled to another input of phase detector 104. An output of phase detector 104 is coupled to node 156, which is coupled to an input of CP block 105. Another output of phase detector 104 is coupled to node 157, which is coupled to another input of CP block 105. Yet another output of phase detector 104 is coupled to node 158, which is coupled to yet another input of CP block 105. Yet another output of phase detector 104 is coupled to node 159, which is coupled to yet another input of CP block 105.

An output of CP block 105 is coupled to node 160, which is coupled to an input of loop filter 106. Another output of CP block 105 is coupled to node 161, which is coupled to another input of loop filter 106. An output of loop filter 106 is coupled to an input of VCO control block 107. Another output of loop filter 106 is coupled to another input of VCO control block 107. An output of VCO control block 107 is coupled to node 164, which is coupled to an input of VCO 108. An output Of VCO 108 is coupled to node 165, which is coupled to output VCOOUT and to an input of phase detector 104. Another output of VCO 108 is coupled to node 166, which is coupled to output VCOOUT* and to another input of phase detector 104.

Frequency reference PLL 102 includes phase detector and counter 111, CP block 112, loop filter 113, VCO control block 114, VCO 115, inputs FREF and FREF*, outputs FRF and FRF* and nodes 167, 168, 169, 170, 171, 172, 173, 174, 175, 176, 177, 178 and 179.

Input FREF is coupled to node 167, which is coupled to an input of phase detector and counter 111. Input FREF* is coupled to node 168, which is coupled to another input of phase detector and counter 111. An output of phase detector and counter 111 is coupled to node 169, which is coupled to an input of CP block 112. Another output of phase detector and counter 111 is coupled to node 170, which is coupled to another input of CP block 112. Yet another output of phase detector and counter 111 is coupled to node 171, which is coupled to yet another input of CP block 112. Still another output of phase detector and counter 111 is coupled to node 172, which is coupled to still another input of CP block 112. An output of CP block 112 is coupled to node 173, which is coupled to an input of loop filter 113. Another output of CP block 112 is coupled to node 174, which is coupled to another input of loop filter 113. An output of loop filter 113 is coupled to node 175, which is coupled to an input of VCO control block 114. Another output of loop filter 113 is coupled to node 176, which is coupled to another input of VCO control block 114. An output of VCO control block 114 is coupled to node 177, which is coupled to an input of VCO 115. An output of VCO 115 is coupled to node 178, which is coupled to output FRF and to an input of phase detector and counter 111. Another output of VCO 115 is coupled to node 179, which is coupled to output FRF* and to another input of phase detector and counter 111.

In frequency reference PLL circuit 102, a stable differential frequency reference signal provided across inputs FREF and FREF* appears across nodes 167 and 168 and at a differential input to phase detector and counter 111. Phase detector and counter 111 allow a desired VCO frequency to be synthesized by scaling the frequency reference signal present across inputs FREF and FREF*. Phase detector and counter 111 compares the input signal to the output of VCO 115, which is fed back through nodes 178 and 179 to phase detector and counter 111. Phase detector and counter 111 produces an output at nodes 169, 170, 171 and 172 representative of the phase difference between the input signal and the VCO output. CP block 112 includes a charge pump that receives pump up and pump down signals from phase detector and counter 111 via nodes 169, 170, 171 and 172. CP block 112 outputs differential pump currents at nodes 173 and 174.

Loop filter 113 receives its input from nodes 173 and 174. Loop filter 113 is a low-pass filter used to smooth out fluctuations in the input signal. It also helps maintain a fixed phase relationship between the input signal and the VCO output. Loop filter 113 outputs filtered differential control voltages at nodes 175 and 176.

VCO control block 114 receives its input from nodes 175 and 176 and translates the filtered differential control voltages into a VCO control signal. If the filtered phase difference signals indicate a lag of the VCO output relative to the input signal, the period of the VCO output is shortened to eliminate the lag. Thus, VCO control block 114 generates a VCO control signal to increase the frequency of the VCO so as to shorten the period of the VCO output. If, however, the filtered phase difference signals indicate the VCO output is leading the input signal, the period of the VCO output is lengthened to eliminate the lag. Thus, VCO control block 114 generates a VCO control signal to decrease the frequency of the VCO so as to lengthen the period of the VCO output. VCO control block 114 provides the VCO control signal to VCO 115 through node 177.

VCO 115 is an oscillator that produces an oscillating output signal having a frequency that is a function of a control signal. The control signal is provided through node 177, and output is provided to nodes 178 and 179. Typical VCOs produce a frequency that is proportional or inversely proportional to a control voltage. The output of VCO 115 is fed back to an input of phase detector and counter 111 to provide a phase locked loop circuit.

In data recovery PLL circuit 101, an incoming raw data signal is provided to nodes 151 and 152 front inputs RD and RD*. The incoming data signal is delayed by one-third cell delay one-shot 103. The delay provided by one-third cell delay one-shot 103 is dependent upon a control voltage provided at node 153. One-third cell delay one-shot 103 outputs the delayed data signal to nodes 154 and 155.

The delayed data signal from nodes 154 and 155 is applied to a PLL including phase detector 104, CP block 105, loop filter 106, VCO control block 107 and VCO 108. Phase detector 104 compares the phase of the output of VCO 108 at nodes 165 and 166 with the delayed data signal from one-third cell delay one-shot 103 at nodes 154 and 155. Phase detector 104 outputs signals at nodes 156, 157, 158 and 159 representative of the relative phase difference between the inputs. The phase detector outputs, which include pump up and pump down signals, are applied to CP block 105. CP block 105 includes a charge pump which produces differential pump current outputs at nodes 160 and 161. Loop filter 106 receives its input from nodes 160 and 161 and performs low pass filtering on the signals to reduce the PLL's sensitivity to transient phase jitter and other spurious phenomena.

Loop filter 106 provides outputs at nodes 162 and 163. The lowpass-filtered differential control voltages at nodes 162 and 163 are applied to VCO control block 107, which determines whether the VCO is in phase with or is leading or lagging the PLL input signals present at nodes 154 and 155. If the VCO is in phase with the input signals, VCO control block 107 does not alter the characteristics of VCO 108. However, if VCO 108 produces outputs at nodes 165 and 166 that lag the input signals, VCO control block 107 adjusts a VCO control voltage at node 164 to increase the frequency of VCO 108 so as to bring VCO 108 back into phase with the input signal. If VCO 108 leads the input signals, VCO control block 107 adjusts a VCO control voltage at node 164 to reduce the frequency of VCO 108 so as to bring VCO 108 back into phase with the input signals.

VCO 108 is a voltage controlled oscillator that is controlled by the control input present at node 164 and that produces outputs at nodes 165 and 166. Nodes 165 and 166 are coupled to outputs VCOOUT and VCO-OUT* and to the inputs of phase detector 104.

Input VREF is applied to node 153, which is coupled to inputs of one-third cell delay one-shot 103, RRC one-shot 109 and write precompensation one-shot 110. Input VREF is used to control the delay provided by these one-shots to attempt to match the frequency at which the system is operating. If the system is operating at a lower frequency, the delay must be lengthened to match the longer period associated with the lower frequency. If the system is operating at a higher frequency, the delay must be shortened to match the shorter period associated with the higher frequency.

In FIG. 1, input VREF is dependent upon the center frequency of VCO 108. Since input VREF is used to control the delay of one-shots 103, 109 and 110, the delay of these one-shots is also dependent upon the center frequency of VCO 108. Since a PLL is typically capable of locking over a range of frequencies, not just at the center frequency, an error may exist in the delay of one-shots 103, 109 and 110 if VCO 108 is operating at a frequency different from its center frequency. Thus, system performance may be diminished when the prior art system is employed.

FIG. 2 illustrates a prior art circuit for controlling one-shot delays. FIG. 2 is similar to FIG. 1. FIG. 2 illustrates data recovery PLL circuit 201 and frequency reference PLL circuit 102. Frequency reference PLL circuit 102 of FIG. 2 is identical to frequency reference PLL circuit 102 of FIG. 1. Data recovery PLL circuit 201 of FIG. 2 is similar to data recovery PLL circuit 101 of FIG. 1. However, whereas the system of FIG. 1 includes one-third cell delay one-shot 103, RRC one-shot 109 and write precompensation one-shot 110 receiving input VREF through node 153 and VCO control block 107 passing a control signal through node 164 to VCO 108, the system of FIG. 2 has VCO control block 107 passing a control signal through node 253 to VCO 108 and to one-third cell delay one-shot 103 and RRC one-shot 109. Input VREF is not present in FIG. 2. Also, VCO control block 107 has an additional output for providing an additional control signal through node 280 to conversion block 216. Conversion block 216 converts the additional control signal at node 280 into a control voltage that may be used to control a one-shot. Conversion block 216 produces an output node 281 that is received by write precompensation one-shot 110.

The delays provided by one-third cell delay one-shot 103 and RRC one-shot 109 are dependent upon the control signal provided at node 253. The delay provided by write precompensation one-shot is dependent upon the control signal present at node 280. The control signals at nodes 253 and 280 are provided by VCO control block 107. Thus, the output pulse durations of one-third cell delay one-shot 103, RRC one-shot 109 and write precompensation 110 are all controlled by VCO control block 107. Since VCO control block 107 produces outputs which determine VCO frequency variation from the VCO center frequency, the one-shot pulse durations track the VCO frequency variation rather than the VCO center frequency. However, VCO frequency variation may not always represent a corrective action to ensure locking of the PLL onto the input signal. VCO frequency variation can result from spurious phase jitter in the input data. Such phase jitter in the input signal can result in jitter of the outputs of phase detector 104, which can in turn cause jitter of the outputs of VCO control block 107, leading to jitter in the duration of the one-shot output pulses.

Because of the sensitivity to input data jitter, system performance may be diminished when the prior art system is employed.

Thus, there is a need for a one-shot control circuit that maintains accuracy over the entire PLL locking range and that is immune to data jitter.

SUMMARY OF THE INVENTION

A one-shot control mechanism for close tracking of one-shot period is provided. The present invention derives one-shot period duration from a frequency reference PLL. The frequency reference PLL runs at the expected frequency of data capture. Thus, the one-shot duration is based on the expected frequency of data capture rather than on the VCO center frequency or on the VCO frequency variation. Since the frequency reference PLL is independent of the data recovery PLL, the frequency reference PLL is insensitive to data phase error or other instantaneous changes when data capture VCO is undergoing a data acquisition. Thus, the present invention is immune to data input jitter.

While the prior art relied on the data capture PLL to provide control of one-shot timing, the present invention uses a frequency reference PLL to control one-shot timing. The frequency reference PLL produces an output representative of the expected frequency of the data being read. The one-shots to be controlled are coupled to a signal provided by the frequency reference PLL. Since the durations of the one-shots tracks the expected frequency of the incoming data, which is provided by a stable and independent frequency source, the one-shots provide a stable and accurate period duration that closely tracks the frequency at which the system operates.

In the preferred embodiment of the present invention, a one-shot control mechanism is provided that includes a frequency reference PLL circuit and a data capture PLL circuit. A signal generated by the VCO control block of the frequency reference PLL circuit is used to control the durations of a window shift one-shot, a one-third cell delay one-shot, an RRC one-shot and a write precompensation one-shot.

The data capture PLL circuit tracks the incoming data signal and provides an output in phase with that signal. Thus, the data capture PLL adjusts to variations in the incoming data timing. These variations are not usually predictable and may not provide stability and reliability. However, the frequency reference PLL circuit provides a signal representing the expected frequency of the incoming data stream. The expected frequency of the incoming data stream may change during different data accesses, and the frequency reference PLL will change accordingly, but the expected frequency of incoming data is unaffected by data jitter or other transient irregularities and is much more stable and reliable.

DETAILED DESCRIPTION OF THE INVENTION

A one-shot control mechanism is described. In the following description, numerous specific details are set forth in order to provide a more thorough understanding of the present invention. It will be apparent, however, to one skilled in the art, that the present invention may be practiced without these specific details. In other instances, well-known features have not been described in detail in order not to unnecessarily obscure the present invention.

In circuits where a pulse is desired to have a specific duration, a one-shot is often used to control the duration of the pulse. A one-shot is triggered by the rising or falling edge of a signal and produces a pulse having a specified duration. Most one-shots provided a fixed pulse duration that cannot be altered based upon other system parameters. However, PLL circuits operate over a range of frequencies. When operating at a lower frequency, their signals have a longer period, and when operating at a higher frequency, their signals have a shorter period. When one-shots are used with a PLL circuit, it is desirable to be able to adjust the one-shot duration in proportion to the period of the PLL signals. Thus, the relationship between the duration of the one-shot signals and the period of the PLL signals may be maintained constant relative to one another. Thus, there is a need for a mechanism to provide accurate and stable control of the durations of one-shots and to ensure that the one-shot durations track the frequency of the PLL.

Since the data recovery PLL circuit and the frequency reference PLL circuit of the prior art were fabricated on separate integrated circuits (ICs), it was not feasible to produce a one-shot control signal within the frequency reference PLL circuit and provide it to one-shots associated with the data recovery PLL circuit. The present invention allows the data recovery PLL circuit and the frequency reference PLL circuit to be fabricated on the same By placing both PLLs on the same IC, a one-shot control signal originating from within one PLL may be used to control one-shots associated with the other PLL.

Figure 1:
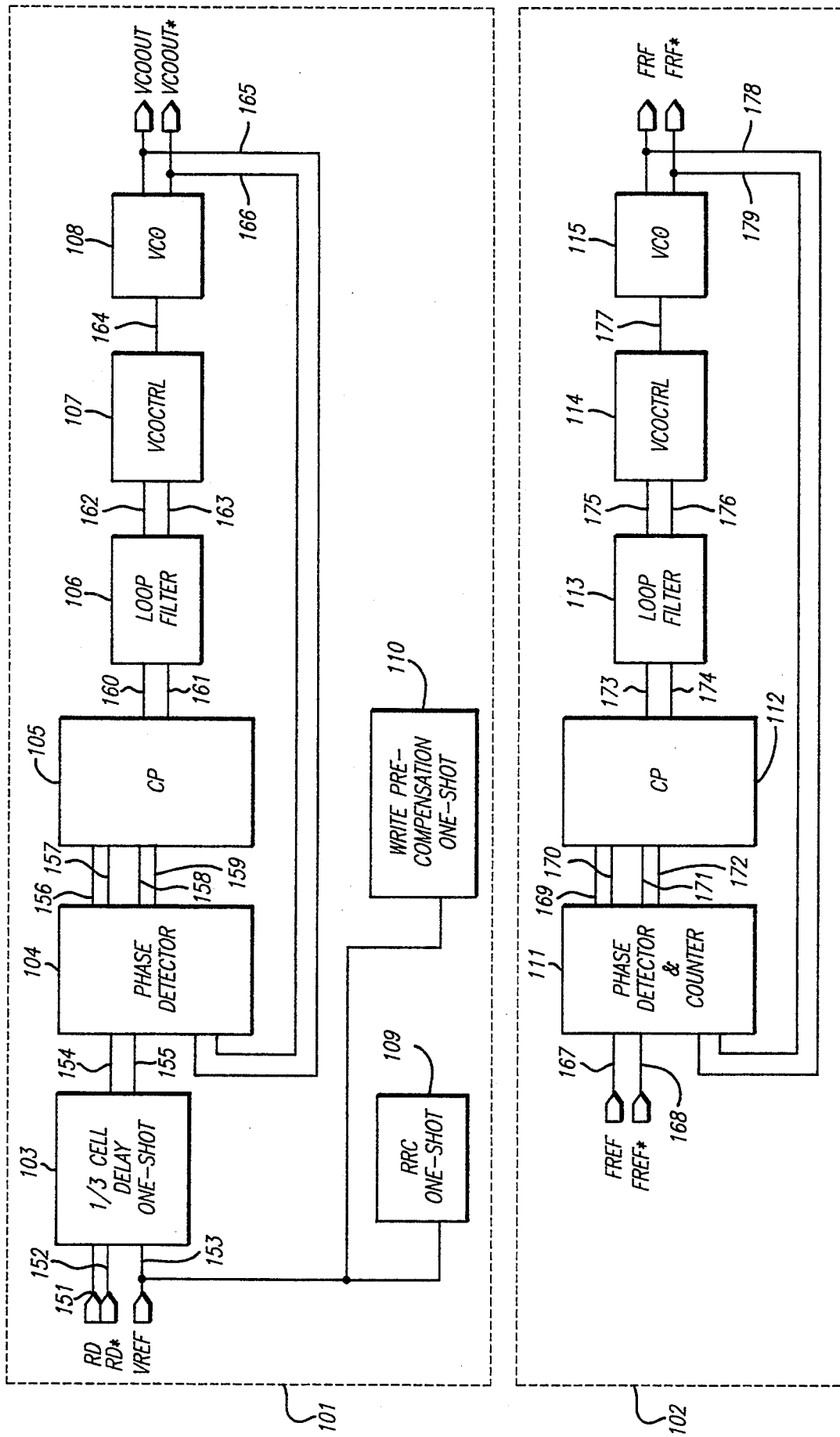
FIG. 1 is a block diagram of a prior art one-shot control mechanism that tracks VCO center frequency.
Figure 2:
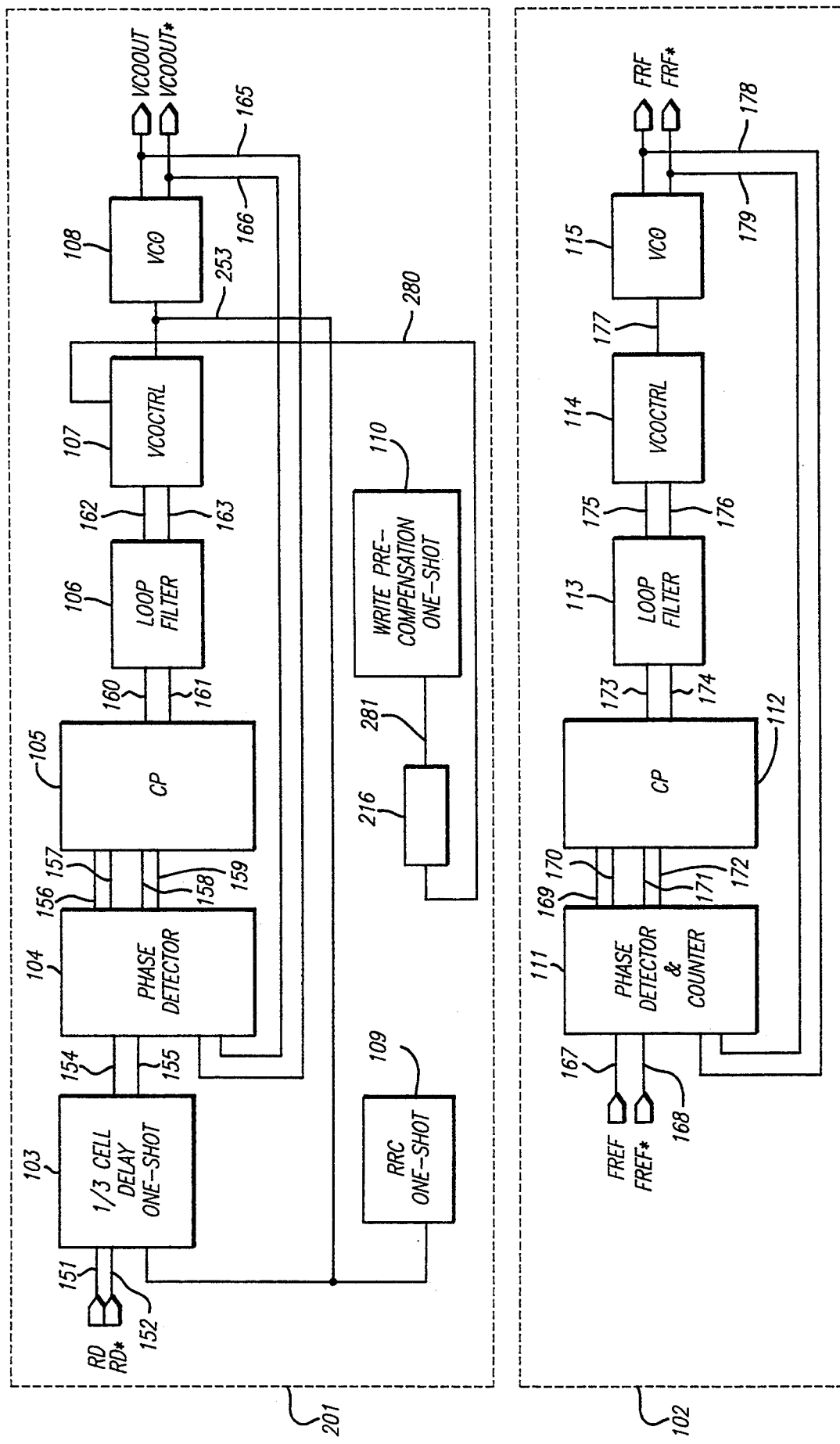
FIG. 2 is a block diagram of a prior art one-shot control mechanism that tracks VCO frequency variation.
Figure 3:
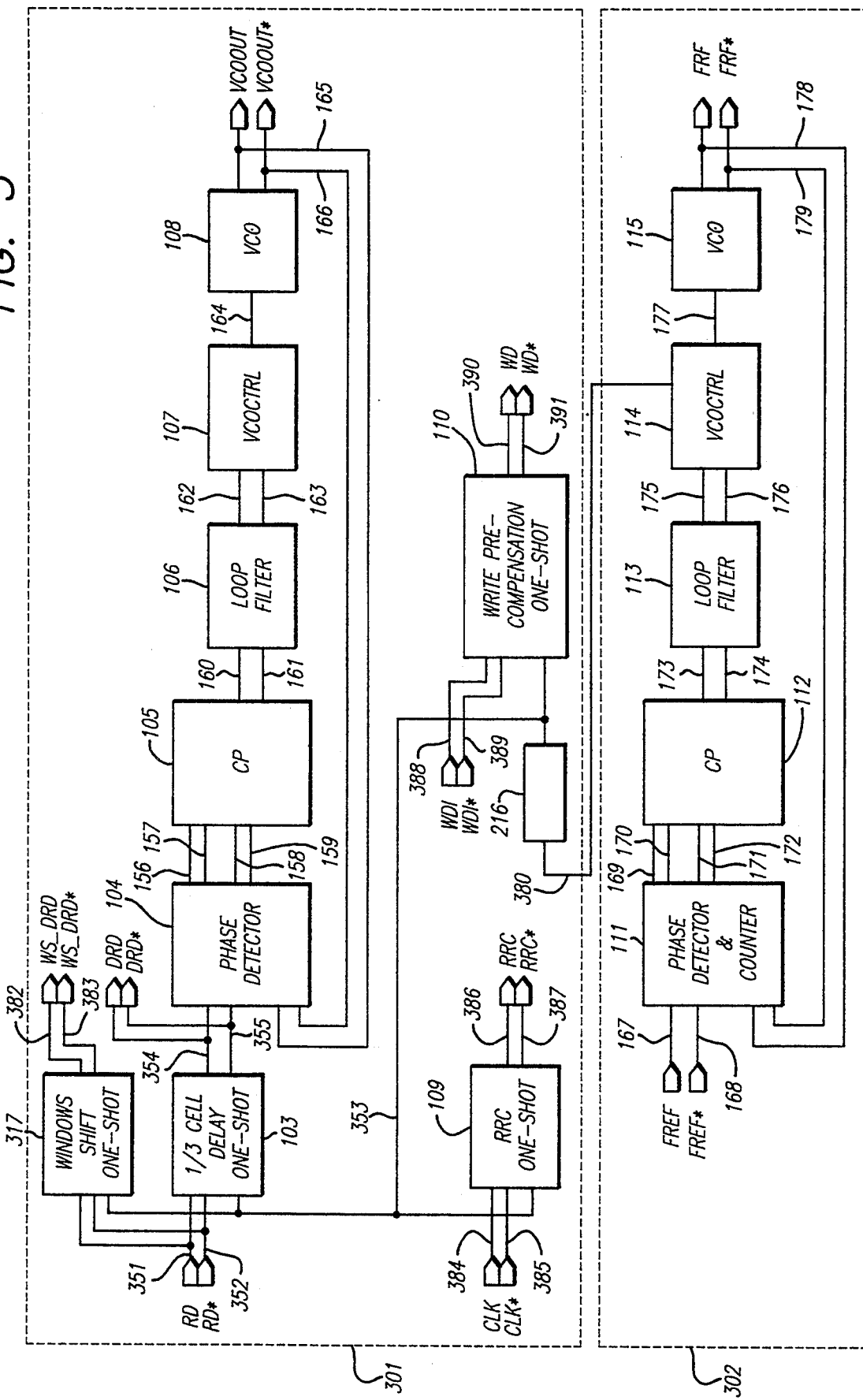
FIG. 3 is a block diagram of the preferred embodiment of the present invention.

FIG. 3 illustrates the preferred embodiment of the present invention. FIG. 3 illustrates data recovery PLL circuit 301 and frequency reference PLL circuit 302. In the present invention, data recovery PLL circuit 301 and frequency reference PLL circuit 302 may be implemented in the same physical structure, typically on the same integrated circuit, allowing effective communication of signals between the circuits.

Data recovery PLL circuit 301 includes ⅓ cell delay one-shot 103, phase detector 104, CP block 105, loop filter 106, VCO control block 107, VCO 108, RRC pulse width one-shot 109, conversion block 216, write precompensation one-shot 110, window shift one-shot 317, inputs RD and RD*, outputs VCOOUT and VCOOUT* and nodes 156, 157, 158, 159, 160, 161, 162, 163, 164, 165, 166, 351, 352, 353, 354, 355, 380, 382, 383, 384, 385, 386, 387, 388, 389, 390 and 391.

Input RD is coupled to node 351, which is coupled to an input of ⅓ cell delay one-shot 103 and to an input of window shift one-shot 317. Input RD* is coupled to node 352, which is coupled to another input of ⅓ cell delay one-shot 103 and to another input of window shift one-shot 317. One output of ⅓ cell delay one-shot 103 is coupled to node 354, which is coupled to an input of phase detector 104 and to output DRD. Another output of ⅓ cell delay one-shot 103 is coupled to node 355, which is coupled to another input of phase detector 104 and to output DRD*. An output of phase detector 104 is coupled to node 156, which is coupled to an input of CP block 105. Another output of phase detector 104 is coupled to node 157, which is coupled to another input of CP block 105. Yet another output of phase detector 104 is coupled to node 158, which is coupled to yet another input of CP block 105. Yet another output of phase detector 104 is coupled to node 159, which is coupled to yet another input of CP block 105.

An output of CP block 105 is coupled to node 160, which is coupled to an input of loop filter 106. Another output of CP block 105 is coupled to node 161, which is coupled to another input of loop filter 106. An output of loop filter 106 is coupled to node 162, which is coupled to an input of VCO control block 107. Another output of loop filter 106 is coupled to node 163, which is coupled to another input of VCO control block 107. An output of VCO control block 107 is coupled to node 164, which is coupled to an input of VCO 108. An output of VCO 108 is coupled to node 165, which is coupled to output VCOOUT and to an input of phase detector 104. Another output of VCO 108 is coupled to node 166, which is coupled to output VCOOUT* and to another input of phase detector 104.

Frequency reference PLL 102 includes phase detector and counter 111, CP block 112, loop filter 113, VCO control block 114, VCO 115, inputs FREF and FREF*, outputs FRF and FRF* and nodes 167, 168, 169, 170, 171, 172, 173, 174, 175, 176, 177, 178, 179 and 380.

Input FREF is coupled to node 167, which is coupled to an input of phase detector and counter 111. Input FREF* is coupled to node 168, which is coupled to another input of phase detector and counter 111. An output of phase detector and counter 111 is coupled to node 169, which is coupled to an input of CP block 112. Another output of phase detector and counter 111 is coupled to node 170, which is coupled to another input of CP block 112. Yet another output of phase detector and counter 111 is coupled to node 171, which is coupled to yet another input of CP block 112. Still another output of phase detector and counter 111 is coupled to node 172, which is coupled to still another input of CP block 112. An output of CP block 112 is coupled to node 173, which is coupled to an in-put of loop filter 113. Another output of CP block 112 is coupled to node 174, which is coupled to another input of loop filter 113. An output of loop filter 113 is coupled to node 175, which is coupled to an input of VCO control block 114. Another output of loop filter 113 is coupled to node 176, which is coupled to another input of VCO control block 114. An output of VCO control block 114 is coupled to node 177, which is coupled to an input of VCO 115. An output of VCO 115 is coupled to node 178, which is coupled to output FRF and to an input of phase detector and counter 111. Another output of VCO 115 is coupled to node 179, which is coupled to output FRF* and to another input of phase detector and counter 111.

An additional output is provided frown VCO control block 114 at node 380. The signal at node 380 is passed to data recovery PLL circuit 301 and used to control the duration of the one-shots of data recovery PLL circuit 301.

In frequency reference PLL circuit 302, a stable differential frequency reference signal is input across inputs FREF and FREF* and appears across nodes 167 and 168 and at a differential input to phase detector and counter 111. The present invention is not limited to a differential input, but may be practiced with other types of inputs including a single-ended or unbalanced input. Phase detector and counter 111 allows a desired VCO frequency to be synthesized by scaling the frequency reference signal at inputs FREF and FREF*. Phase detector and counter 111 compares the input signal to the output of VCO 115, which is fed back through nodes 178 and 179 to phase detector and counter 111. Phase detector and counter 111 produces an output at nodes 169, 170, 171 and 172 representative of the phase difference between the input signal and the VCO output. CP block 112 functions as a charge pump. CP block 112 receives pump up and pump down signals from phase detector and counter 111 through nodes 169, 170, 171 and 172. CP block 112 produces differential pump current output signals at nodes 173 and 174.

Loop filter 113 receives its input from nodes 173 and 174. Loop filter 113 is a low-pass filter used to smooth out fluctuations in the input signal. It also helps maintain a fixed phase relationship between the input signal and the VCO output. Loop filter 113 outputs filtered differential control voltages at nodes 175 and 176.

VCO control block 114 receives differential control voltages from nodes 175 and 176 and translates the filtered differential control voltages into a VCO control voltage signal. If the filtered phase difference signals indicate a lag of the VCO output relative to the input signal, the period of the VCO output is shortened to eliminate the lag. Thus, VCO control block 114 generates a VCO control signal to increase the frequency of the VCO so as to shorten the period of the VCO output. If, however, the filtered phase difference signals indicate the VCO output is leading the input signal, the period of the VCO output is lengthened to eliminate the lag. Thus, VCO control block 114 generates a VCO control signal to decrease the frequency of the VCO so as to lengthen the period of the VCO output. VCO control block 114 provides the VCO control voltage signal to VCO 115 through node 177. In addition to producing a control voltage signal for VCO 115, VCO control block 114 also produces a control current, which passes through node 380, for use in data recovery PLL circuit 301.

VCO 115 is an oscillator that produces an oscillating output signal having a frequency that is a function of a control signal. The control signal is provided through node 177, and output is provided to nodes 178 and 179.

Typical VCOs produce a frequency that is proportional or inversely proportional to a control voltage. The output of VCO 115 is fed back to an input of phase detector and counter 111 to provide a phase locked loop circuit.

In data recovery PLL circuit 301, an incoming raw data signal is provided to nodes 351 and 352 from inputs RD and RD*. The raw data signal from nodes 351 and 352 is provided to window shift one-shot 317, which delay produces an output pulse dependent upon the control signal present at node 353. Window shift one-shot 317 provides outputs $WS_{13}DRD$ and $WS_{13}DRD*$ through nodes 382 and 383, respectively. The incoming data signal is delayed by one-third cell delay one-shot 103. The delay provided by one-third cell delay one-shot 103 is dependent upon a control voltage provided at node 353. One-third cell delay one-shot 103 outputs the delayed data signal to nodes 354 and 355. The delayed data signal from nodes 354 and 355 appears at outputs DRD and DRD*, respectively.

The delayed data signal from nodes 354 and 355 is applied to a PLL including phase detector 104, CP block 105, loop filter 106, VCO control block 107 and VCO 108. Phase detector 104 compares the phase of the output of VCO 108 at nodes 165 and 166 with the delayed data signal from one-third cell delay one-shot 103 at nodes 154 and 155. Phase detector 104 outputs signals at nodes 156, 157, 158 and 159 representative of the relative phase difference between the inputs. The phase detector outputs include pump up and pump down signals that are applied to CP block 105. CP block 105 functions as a charge pump and produces differential pump current output signals at nodes 160 and 161. Loop filter 106 receives its input from nodes 160 and 161 and performs low pass filtering on the signals to reduce the PLL's sensitivity to transient phase jitter and other spurious phenomena.

Loop filter 106 provides outputs at nodes 162 and 163. The differential control voltages at nodes 162 and 163 are applied to VCO control block 107, which determines whether the VCO is in phase with or is leading or lagging the PLL input signals present at nodes 154 and 155. If the VCO is in phase with the input signals, VCO control block 107 does not alter the characteristics of VCO 108. However, if VCO 108 produces outputs at nodes 165 and 166 that lag the input signals, VCO control block 107 adjusts a VCO control voltage at node 164 to increase the frequency of VCO 108 so as to bring VCO 108 back into phase with the input signal. If VCO 108 leads the input signals, VCO control block 107 adjusts a VCO control voltage at node 164 to reduce the frequency of VCO 108 so as to bring VCO 108 back into phase with the input signals.

VCO 108 is a voltage controlled oscillator that is controlled by the control input present at node 164 and that produces outputs at nodes 165 and 166. Nodes 165 and 166 are coupled to outputs VCOOUT and VCOOUT* and to the inputs of phase detector 104.

Data recovery PLL circuit 301 receives a control current from frequency reference PLL circuit 302 via node 380. The control current at node 380 is applied to conversion block 216. Conversion block 216 converts the control current at node 380 into a control voltage for controlling one-shots. The one-shot control voltage from conversion block 216 is provided at node 353. Node 353 provides a timing control voltage to control the output duration of window shift one-shot 317, one-third cell delay one-shot 103, RRC one-shot 109 and write precompensation one-shot 110.

Although the preferred embodiment of the present invention uses some current signals and some voltage signals and provides for conversion between current and voltage, the present invention may be practiced with current signals, voltage signals or a combination of current and voltage signals.

When triggered by a level transition at nodes 351 and 352, window shift one-shot 317 produces output pulses at nodes 382 and 383 having durations dependent upon a voltage received from node 353. The output pulses at nodes 382 and 383 are coupled to outputs $WS_{13}DRD$ and $WS_{13}DRD*$, respectively.

Inputs CLK and CLK* provide signals to nodes 384 and 385, respectively. When triggered by a level transition at nodes 384 and 385, RRC one-shot 109 produces output pulses at nodes 386 and 387 having durations dependent upon a signal received from node 353. The output pulses at nodes 386 and 387 are coupled to outputs RRC and RRC*, respectively.

Inputs WDI and WDI* provide signals to nodes 388 and 389, respectively. When triggered by a level transition at nodes 388 and 389, write precompensation one-shot 110 produces output pulses at nodes 390 and 391 having durations dependent upon a signal received from node 353. The output pulses at nodes 390 and 391 are coupled to outputs WD and WD*.

While data recovery PLL circuit 301 adjusts its phase and frequency according to the phase and frequency of the data being read, frequency reference PLL circuit 302 maintains a steady frequency at the expected rate of data transfer. The frequency of frequency reference PLL circuit 302 varies only to the extent that a different data transfer frequency is expected. Thus, frequency reference PLL circuit 302 is much more stable, predictable and immune to transient or spurious phenomena than data recovery PLL circuit 301.

By controlling the output pulse durations of the one-shots of data recovery PLL circuit 301 with a signal from frequency reference PLL circuit 302, the durations of the one-shots can be made to more precisely track the operating frequency of the system.

Thus, a one-shot control mechanism for providing close tracking of one-shot period to VCO period has been provided.

We claim:

1. A circuit comprising:
   a first data input for receiving a data signal;
   a first phase locked loop (PLL) coupled to said first data input, for tracking said data signal;
   a frequency reference input for receiving a frequency reference signal;
   a second PLL coupled to said frequency reference input, for tracking said frequency reference signal and for providing a one-shot duration control signal; and
   a first one-shot coupled to said second PLL for receiving said one-shot control signal and for providing an first output pulse, said first output pulse dependent on said data signal.

2. The circuit of claim 1 wherein said first output pulse has a duration dependent on said one-shot control signal.

3. The circuit of claim 1 further comprising a second one-shot coupled to said second PLL for receiving said one-shot control signal and for providing a second output pulse.

4. The circuit of claim 3 wherein said first and second output pulses have durations dependent on said one-shot control signal.

5. The circuit of claim 4 wherein said first one-shot is coupled to said first PLL and wherein said first PLL receives said first output pulse.

6. A circuit comprising:
   a first oscillator for producing a first oscillator output;
   control means coupled to said first oscillator for controlling a period of said first oscillator and for providing a one-shot duration control signal;
   a first one-shot coupled to said control means for receiving said one-shot control signal and for producing a first output pulse;
   a second oscillator for producing a second oscillator output signal;
   comparison means coupled to said second oscillator and to said first one-shot for comparing timing of said second oscillator output signal to said output pulse.

7. The circuit of claim 6 wherein said first output pulse has a first duration dependent upon said one-shot control signal.

8. The circuit of claim 7 wherein said comparison means is a phase detector.

9. The circuit of claim 8 wherein said first oscillator and said control means are included as elements of a first phase locked loop (PLL) and said second oscillator and said comparison means are included as elements of a second PLL.

10. The circuit of claim 9 further comprising a second one-shot coupled to said control means for receiving said one-shot control signal and for producing a second output pulse.

11. The circuit of claim 10 wherein said second output pulse has a second duration dependent upon said one-shot control signal.

12. A method of controlling the duration of a one-shot comprising the steps of:
    producing a one-shot control signal from within a first phase locked loop (PLL);
    producing an output pulse dependent upon said one-shot control signal;
    applying said output pulse to a second PLL.

13. The method of claim 12 wherein said step of producing said output pulse dependent upon said one-shot control signal comprises the steps of:
    applying said one-shot control signal to a control input of a one-shot and
    applying a data signal to a data input of said one-shot.

14. The method of claim 13 wherein said step of applying said output pulse to said second PLL comprises the step of applying said output pulse to a phase comparator of said second PLL.

15. The method of claim 14 wherein said step of producing said one-shot control signal from within said first PLL comprises the step of producing said one-shot control signal from with a VCO control block of said first PLL.

16. An integrated circuit comprising:
    a first PLL circuit block for producing a one-shot control signal;
    a second PLL circuit block coupled to said first PLL for receiving said one-shot control signal, said second PLL circuit block comprising:
    a first one-shot for producing a first output having a first duration proportional to said one-shot control signal.

17. The integrated circuit of claim 16 wherein said first PLL circuit block is a frequency reference PLL circuit block and said second PLL circuit block is a data recovery PLL circuit.

18. The integrated circuit of claim 17 wherein said second PLL circuit further comprises a second one-shot for producing a second output having a second duration proportional to said one-shot control signal.

* * * * *